United States Patent
Harter et al.

(10) Patent No.: US 8,067,939 B2
(45) Date of Patent: Nov. 29, 2011

(54) MAGNETIC RESONANCE GRADIENT COIL FORMED BY TWO DIFFERENT TYPES OF CONDUCTORS

(75) Inventors: Sabrina Harter, Erlangen (DE); Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 289 days.

(21) Appl. No.: 12/426,335

(22) Filed: Apr. 20, 2009

(65) Prior Publication Data

US 2009/0261831 A1  Oct. 22, 2009

(30) Foreign Application Priority Data

Apr. 21, 2008  (DE) .......... 10 2008 019 897

(51) Int. Cl.
*G01V 3/00* (2006.01)
(52) U.S. Cl. ........................ 324/318; 324/309
(58) Field of Classification Search .......... 324/300–322; 600/407–445
See application file for complete search history.

(56) References Cited

U.S. PATENT DOCUMENTS

| | | | |
|---|---|---|---|
| 5,642,049 A | 6/1997 | Harada et al. | |
| 5,804,968 A * | 9/1998 | Richard et al. | 324/318 |
| 5,998,998 A | 12/1999 | Westphal | |
| 6,181,227 B1 * | 1/2001 | Schmidt et al. | 335/299 |
| 6,525,536 B2 * | 2/2003 | Minas et al. | 324/318 |
| 6,933,825 B2 * | 8/2005 | Nowak | 336/200 |
| 7,081,753 B2 * | 7/2006 | Mullen et al. | 324/318 |
| 7,382,133 B1 * | 6/2008 | Morrone | 324/318 |
| 7,888,938 B2 * | 2/2011 | Fath et al. | 324/318 |
| 7,902,826 B2 * | 3/2011 | Yin et al. | 324/318 |
| 7,969,695 B2 * | 6/2011 | Bittner | 361/19 |

* cited by examiner

*Primary Examiner* — Brij Shrivastav
(74) *Attorney, Agent, or Firm* — Schiff Hardin LLP

(57) ABSTRACT

A gradient coil of a magnetic resonance apparatus has a first conductor structure and a second conductor structure connected with one another so that windings of the gradient coil are formed. The first conductor structure is formed exclusively of planar, electrically conductive elements that are insulated from one another. The second conductor structure is formed exclusively of conductive wires insulated from one another.

7 Claims, 1 Drawing Sheet

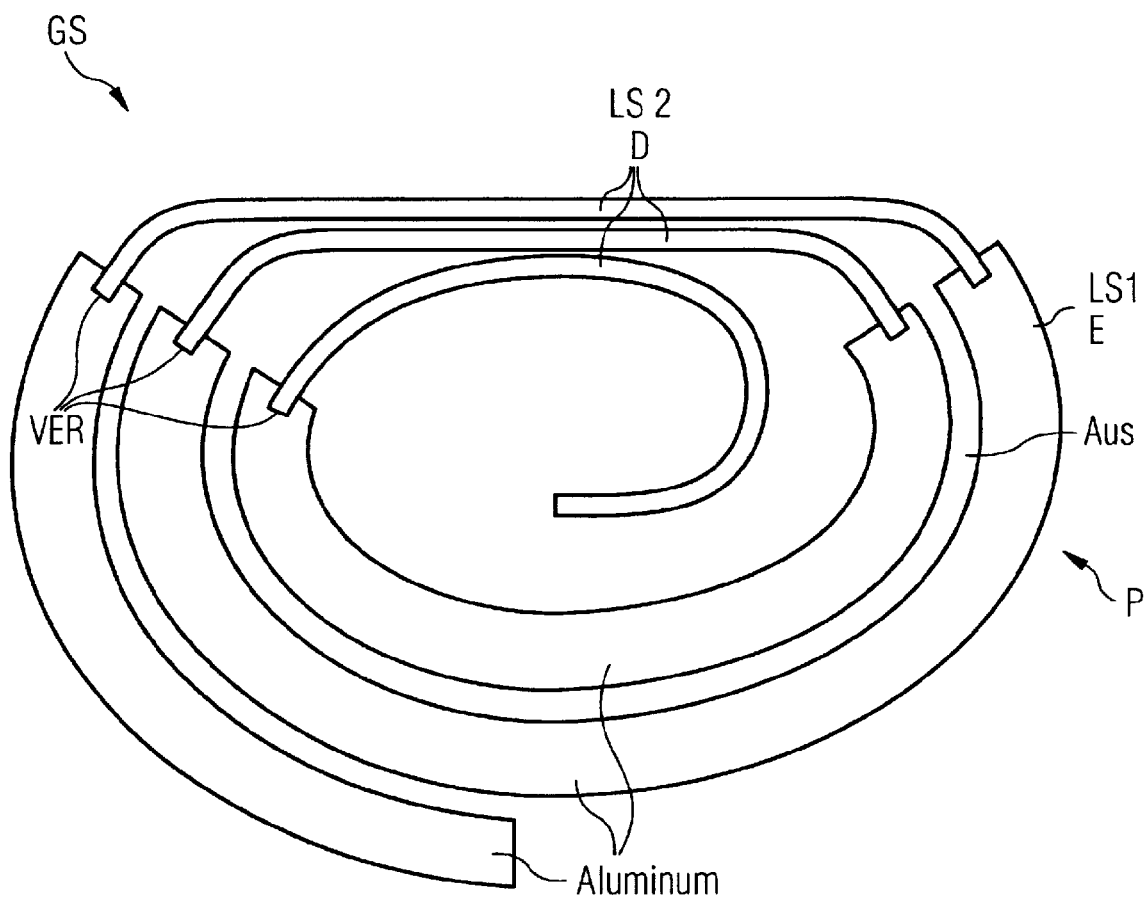

MAGNETIC RESONANCE GRADIENT COIL FORMED BY TWO DIFFERENT TYPES OF CONDUCTORS

BACKGROUND OF THE INVENTION

1. Field of the Invention

The present invention concerns a gradient coil of a magnetic resonance apparatus.

2. Description of the Prior Art

A magnetic resonance apparatus has a gradient coil system that contains three (sub-)gradient coils. For example, a magnetic field gradient is generated in the X-direction with the use of a first gradient coil while a magnetic field gradient in the Y-direction is generated with the use of a second gradient coil, and a third gradient coil generates a magnetic field gradient in the Z-direction.

The XY gradient coils are known as "saddle coils" due to the shape of their design.

It is known to design saddle coils composed of bundled individual wires. In such a coil design, conductor loops that typically include one to six bundled individual wires are fixed on a carrier (substrate) plate, for example by gluing.

The individual wires of a conductor loop are each provided with a lacquer insulation layer (typically 2 to 10 μm in thickness) and are therefore insulated from one another. A common current signal flows through the individual wires of the conductor loops in order to form the gradient field (magnetic field) in an examination region of the magnetic resonance system.

Such saddle coils enable the realization of an optimized current density in a predetermined central coil region in order to form the desired magnetic field in the examination region.

Coil windings made of individual wires offer the advantage that a high number of coil windings can be arranged in a predetermined central coil region.

A disadvantage of coils of this type is a relatively high ohmic resistance due to the individual wires that are used.

It is also known to fashion saddle coils using an electrically conductive plate. For example, elliptically running divider structures (known as traces) are milled into the electrically conductive plate. The plate is subsequently formed into the saddle shape—for example by bending the plate in the shape of a half-cylinder shell.

The traces can also be generated by cutting techniques (for example water jet cutting, laser cutting, etc.) or with the use of punching techniques.

By the curving of the plate into a saddle shape and by the effect of the separating traces, conductor structures are formed that, charged with a current signal, form a desired X-gradient field or Y-gradient field.

The magnetic field efficiency is determined by the maximum achievable current density in a central region of the plate. The requirements for a minimal insulation distance between the coil windings or conductor structures in this middle region result from this factor. Maximum conductor structure cross-sections are used for this determination.

The power consumption of a gradient system from the mains is determined by the ohmic resistance of the gradient coils. A necessity to maximize the cross-section of the respective conductor structures results from this consideration in order to be able to utilize only a limited mains power available to the customer.

Given currents of 500 A to 1000 A that are typical today, in general it is necessary to use 20 to 30 individual conductor loops per quadrant on the plate of the latter type of saddle coil.

The advantage of a gradient coil created from an electrically conductive plate is that the gradient coil has a very low ohmic resistance because a large-area conductive surface, that is reduced only by the width of the trace, is available. Depending on the technique, this trace can be very narrow—even only a few millimeters wide.

A disadvantage, however, is that a dense conductor trace population in the central coil regions can be achieved only with difficulty, because a predetermined winding distance must be maintained in order to maintain insulation stability.

SUMMARY OF THE INVENTION

An object of the present invention is to provide an improved gradient coil that has both a dense conductor trace population and a lower ohmic resistance.

The gradient coil according to the invention has a first conductor structure and a second conductor structure that are connected with one another and form the windings of the gradient coil.

The first conductor structure is composed of planar, electrically conductive elements that are insulated (isolated) from one another.

The second conductor structure is composed of conductive wires that are insulated from one another.

In the gradient coil according to the invention, the two coil embodiment forms known from the prior art are thus advantageously combined with one another.

In coil regions that require a high conductor density, wires or wire segments are used to create coil windings. A good sensitivity and linearity of the magnetic field thus can be achieved in these regions.

In coil regions that allow a lower conductor density, elements with planar design are used as conductor traces to create coil windings.

These elements are advantageously formed from an electrically conductive plate. The plate has a linear recess penetrating by which the elements are formed. The respective transitions between the wires and the planar elements are produced by solder connections.

In comparison to conventional gradient coils that are produced exclusively from wires or wire bundles, the ohmic resistance is reduced in the gradient coil according to the present invention.

The present invention also enables an improvement in the thermal coil properties. Generated heat is quickly dissipated as needed by the flat conductor traces, and less heat arises due to reduced ohmic resistance of the gradient coil.

The present invention enables an improved cylindrical shape with regard to its structural height due to the planar design of the first conductor structure. These surfaces also form an improved supporting surface for additional coil layers that may be arranged on top of them.

In a preferred embodiment, planar conductor structures of an aluminum plate are combined with copper wires in order to save on material costs.

BRIEF DESCRIPTION OF THE DRAWINGS

The single FIGURE is a schematically illustrated plan view of a gradient coil constructed in accordance with the present invention.

DESCRIPTION OF THE PREFERRED EMBODIMENTS

The single FIGURE shows a portion of a gradient coil GS (fashioned as a saddle coil) that is designed according to the invention. The gradient coil GS is for use in a magnetic resonance apparatus The saddle coil here is shown in plan view before spatial shaping thereof to form the saddle shape.

A recess AUS is introduced into an electrically conductive plate P (which is preferably produced from aluminum). This recess AUS penetrates completely through the plate P, such that planar elements E are formed.

For example, the recess AUS can be introduced into the plate P by milling, punching, laser cutting, water jet cutting, etc.

A first conductor structure LS1 is thereby formed that is composed only of planar elements and has a good ohmic resistance.

The first conductor structure LS1 is connected with a second conductor structure LS2 such that windings of the gradient coil GS are formed.

The second conductor structure LS2 is formed only by conducting wires D insulated from one another, such wires D preferably being composed of enameled copper wire.

The first conductor structure LS1 is electrically connected with the second conductor structure LS2 at connection points VER.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil for a magnetic resonance apparatus, comprising:

a gradient coil conductor configuration comprising a first conductor structure and a second conductor structure, said first and second conductor structures being electrically connected with each other to form gradient coil windings, said gradient coil windings being configured to generate a gradient magnetic field in a magnetic resonance apparatus when said gradient coil conductor configuration is supplied with current;

said first conductor structure consisting of a plurality of planar, electrically conductive elements that are insulated from each other and that define a plane in which said first conductor or structure is contained; and said second conductor structure consisting of electrically conductive wires that are insulated from each other.

2. A gradient coil as claimed in claim 1 wherein said planar, electrically conductive elements are formed by an electrically conductive plate having a linear recess therein extending completely through said plate.

3. A gradient coil as claimed in claim 2 wherein said electrically conductive plate is formed of a plate material selected from the group consisting of copper and aluminum.

4. A gradient coil as claimed in claim 3 wherein said electrically conductive wires are formed of a wire material selected from the group consisting of copper and aluminum.

5. A gradient coil as claimed in claim 1 wherein said electrically conductive wires are formed of a wire material selected from the group consisting of copper and aluminum.

6. A gradient coil as claimed in claim 1 wherein said coil windings are spatially shaped to form a saddle coil.

7. A gradient coil as claimed in claim 1 wherein said second conductor structure is also contained in said plane.

* * * * *